(12) United States Patent
Kim et al.

(10) Patent No.: US 7,423,562 B2
(45) Date of Patent: Sep. 9, 2008

(54) EFFECTIVE DECODING METHOD OF H.264/AVC CONTEXT-BASED ADAPTIVE VARIABLE LENGTH CODING

(75) Inventors: Yong-Hwan Kim, Anyang (KR); Tae Beom Lim, Yongin (KR); Byeong Ho Choi, Yongin (KR); Hyok Song, Sungnam (KR); Joon Ki Paik, Seoul (KR); Yoon-Jong Yoo, Anyang (KR)

(73) Assignee: Korea Electronics Technology Institute, Kyunggi-Do (KR)

( * ) Notice: Subject to any disclaimer, the term of this patent is extended or adjusted under 35 U.S.C. 154(b) by 0 days.

(21) Appl. No.: 11/608,262

(22) Filed: Dec. 8, 2006

(65) Prior Publication Data

US 2007/0262886 A1    Nov. 15, 2007

(30) Foreign Application Priority Data

May 11, 2006    (KR)    .................... 10-2006-0042514

(51) Int. Cl.
*H03M 7/40*    (2006.01)

(52) U.S. Cl. .......................................... 341/67; 341/51
(58) Field of Classification Search ................ 341/50, 341/67, 65, 107, 51; 375/240.23
See application file for complete search history.

(56) References Cited

U.S. PATENT DOCUMENTS

| 7,099,387 | B2 * | 8/2006 | Bjontegaard et al. ........ 375/240 |
| 7,292,163 | B1 * | 11/2007 | Fedele ......................... 341/67 |
| 2006/0126743 | A1 * | 6/2006 | Takekawa et al. ...... 375/240.23 |

* cited by examiner

*Primary Examiner*—Peguy JeanPierre
(74) *Attorney, Agent, or Firm*—Edell, Shapiro & Finnan, LLC

(57) ABSTRACT

An effective H.264/AVC CAVLC decoding method is disclosed. In accordance with the method a VLC code is classified into groups according to a correlation thereof, an arithmetic equation is defined for each of the groups, and a decoding is carried out according to the arithmetic equation in order to minimize a memory access by a table look-up and reduce a decoding time and a power consumption.

17 Claims, 11 Drawing Sheets

[FIG. 1]
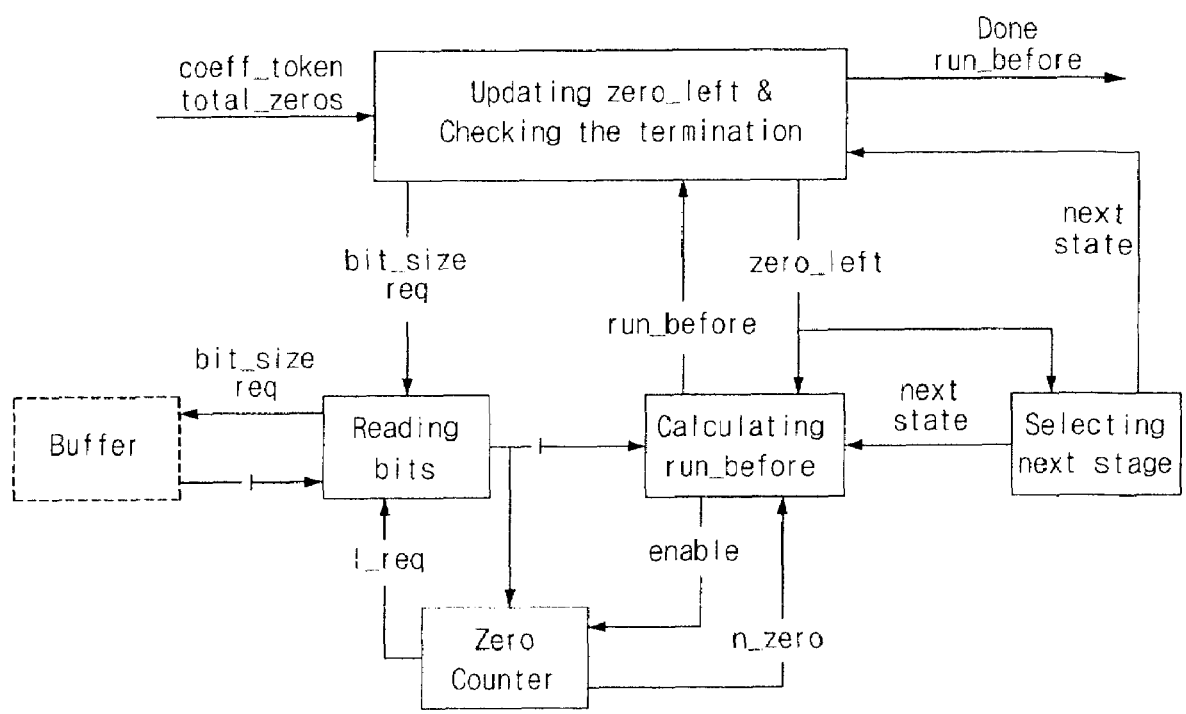

[FIG. 2a]
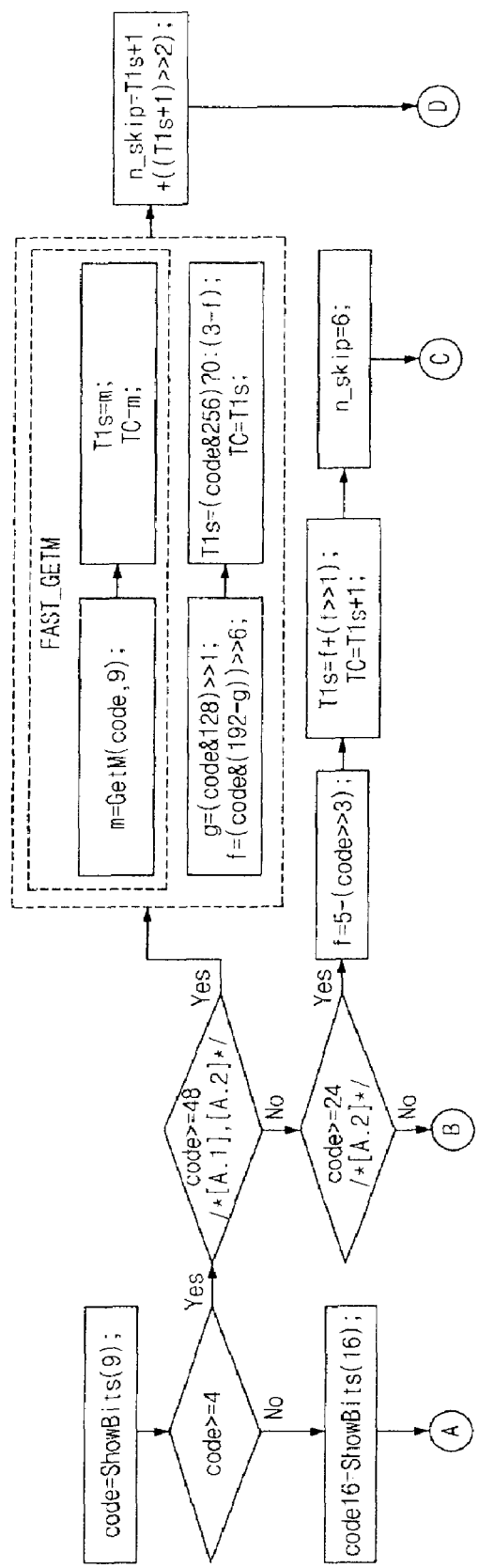

[FIG. 2b]
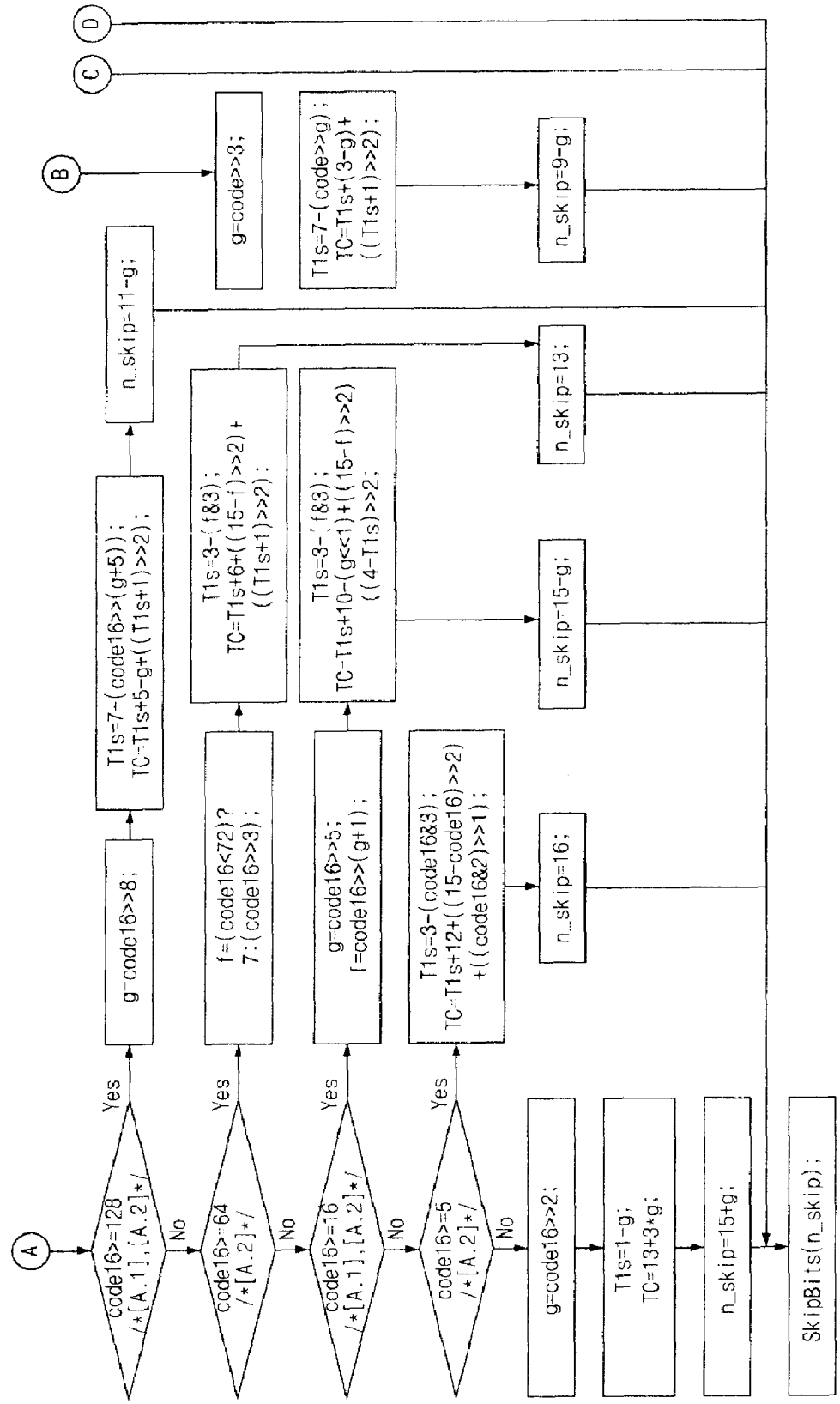

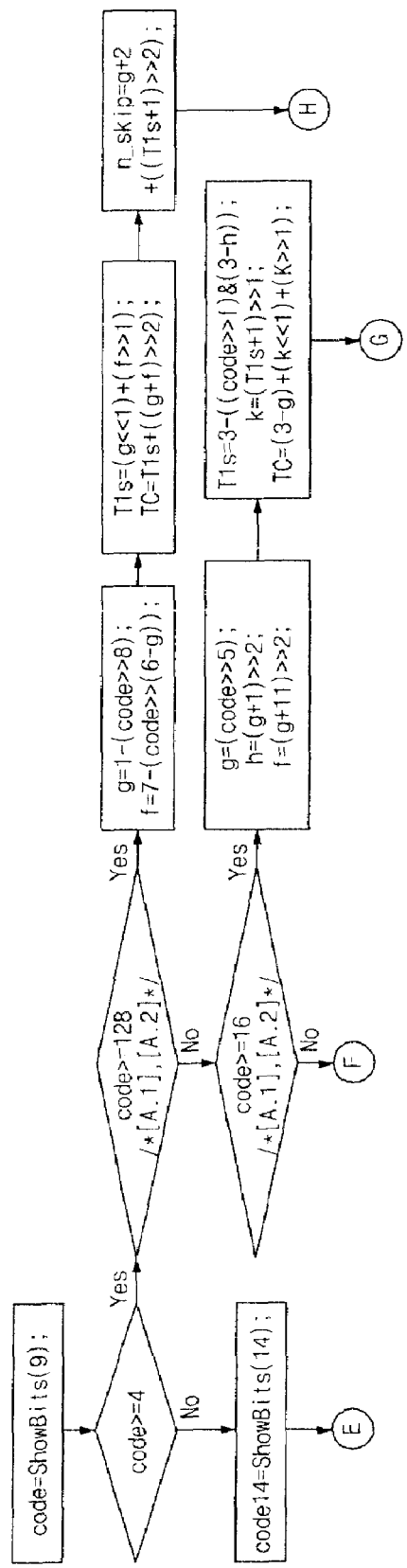
[FIG. 3a]

[FIG. 3b]
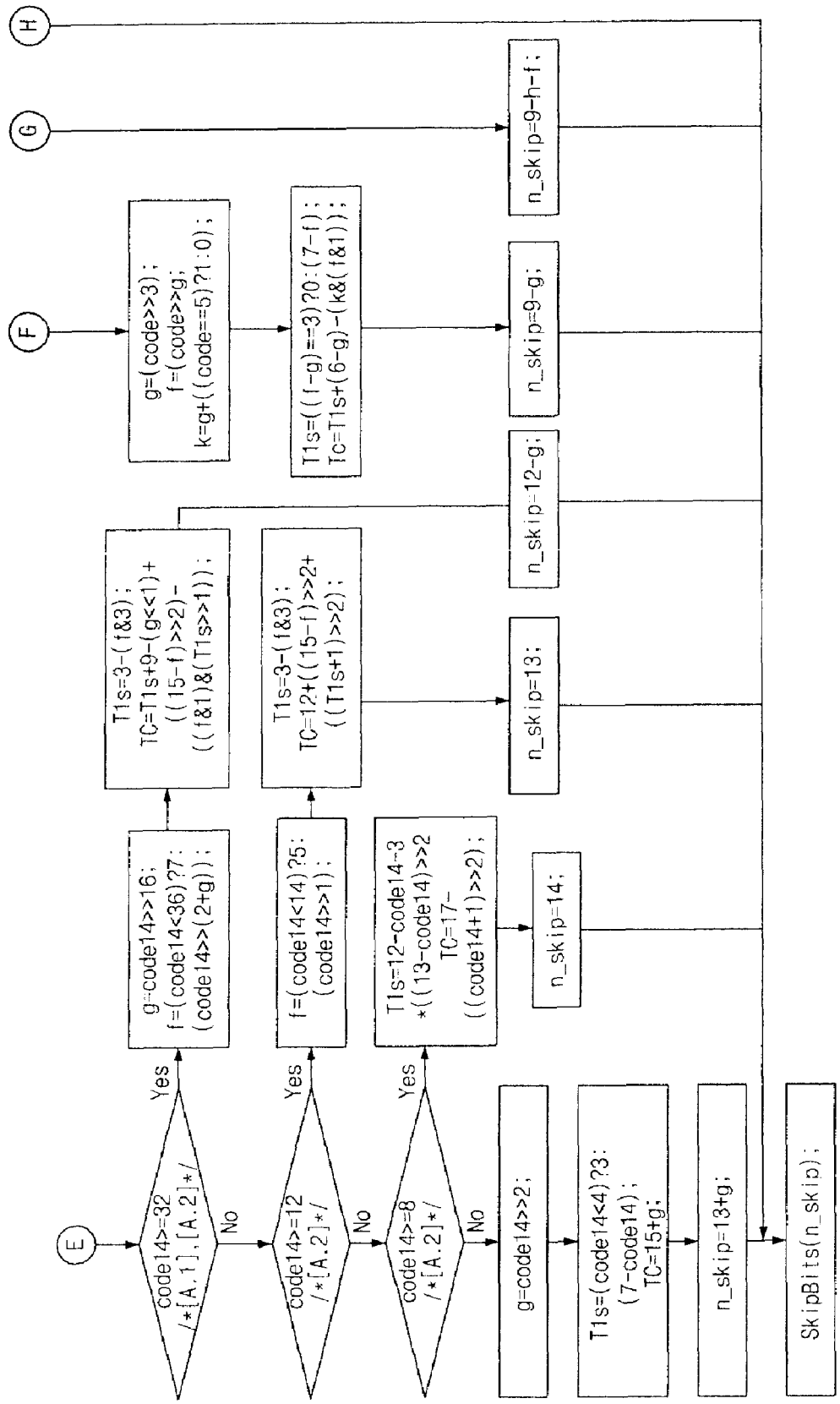

[FIG. 4a]
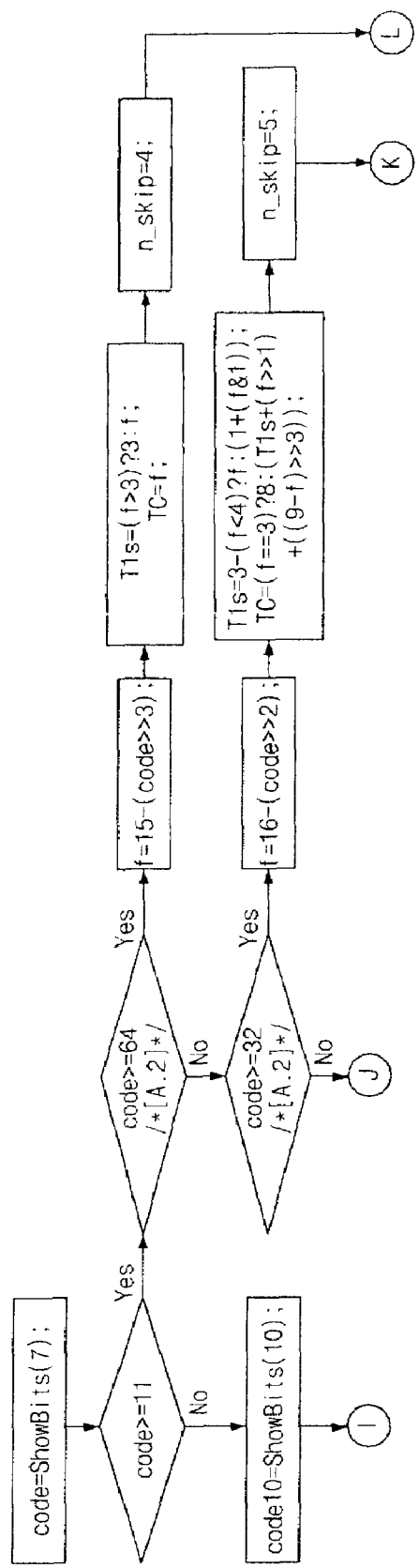

[FIG. 4b]
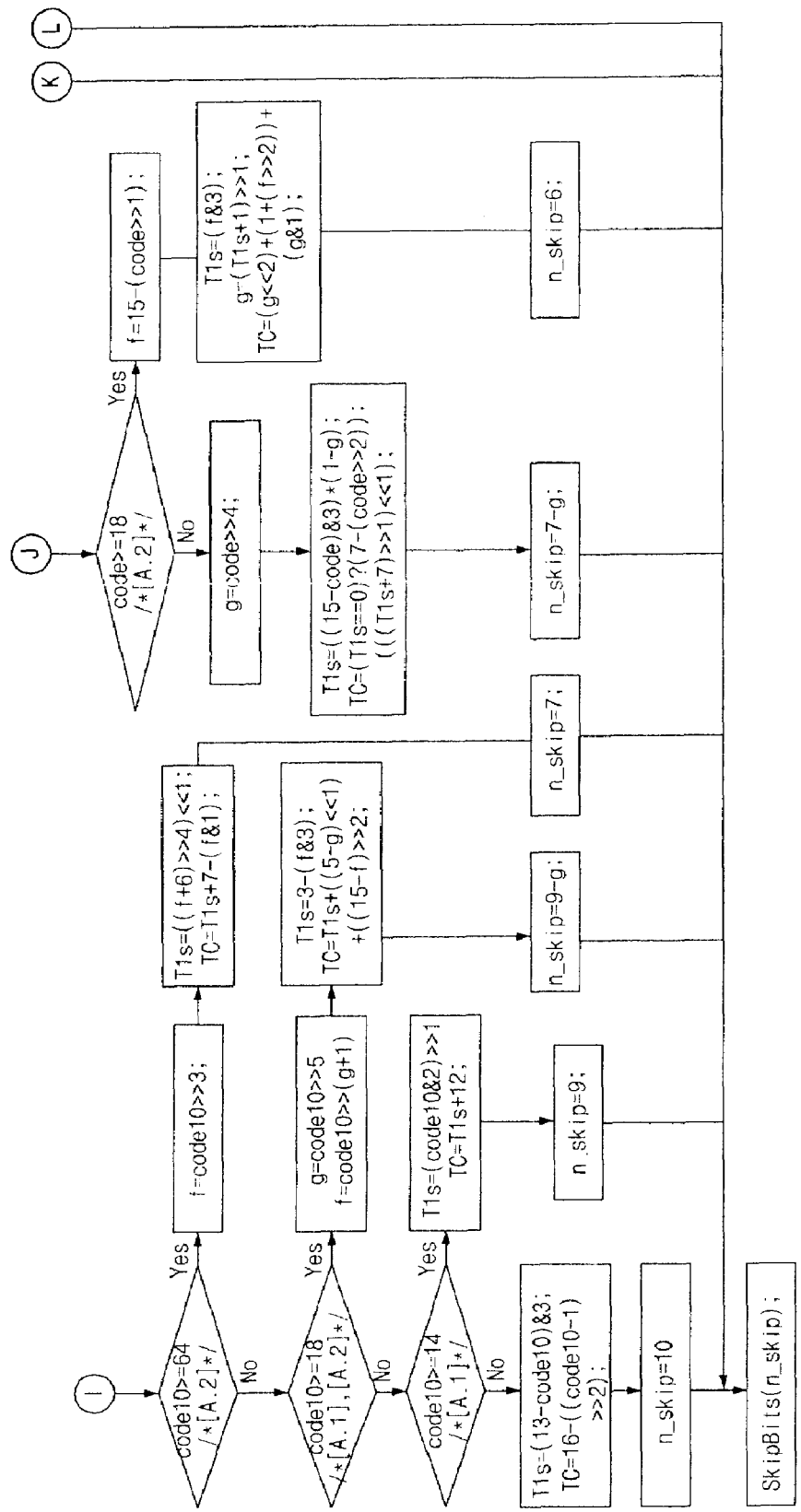

[FIG. 5]
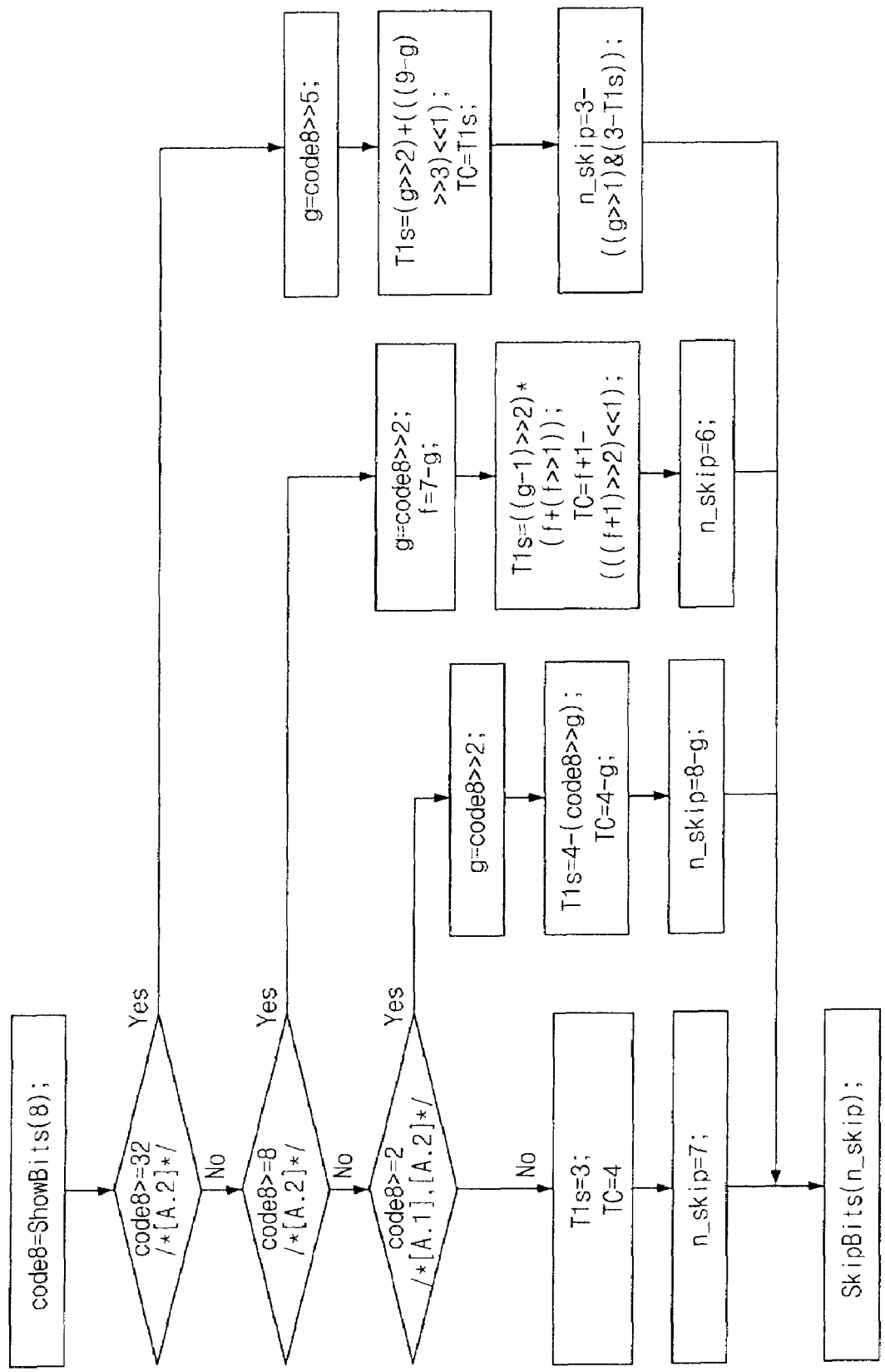

[FIG. 6]
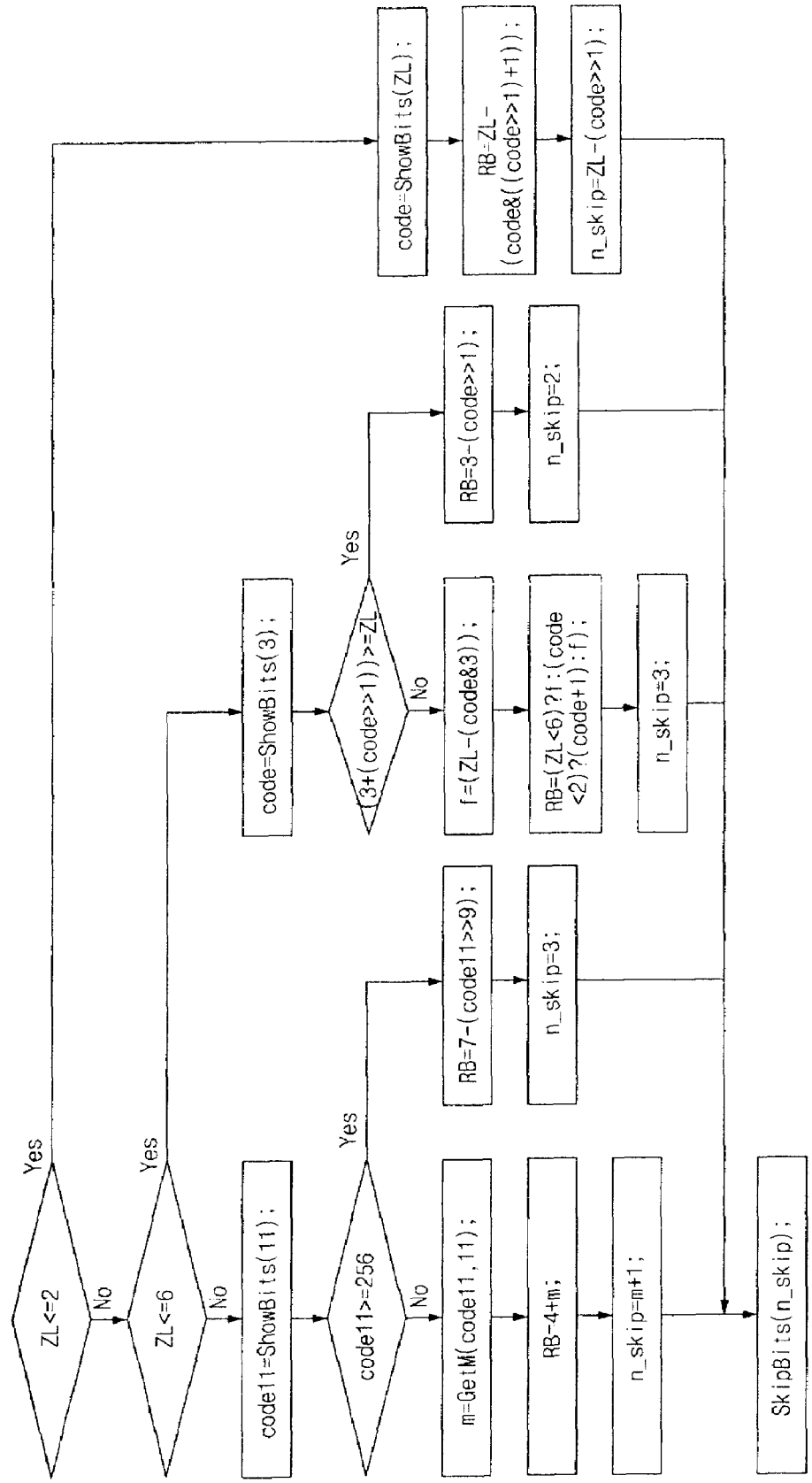

[FIG. 7]
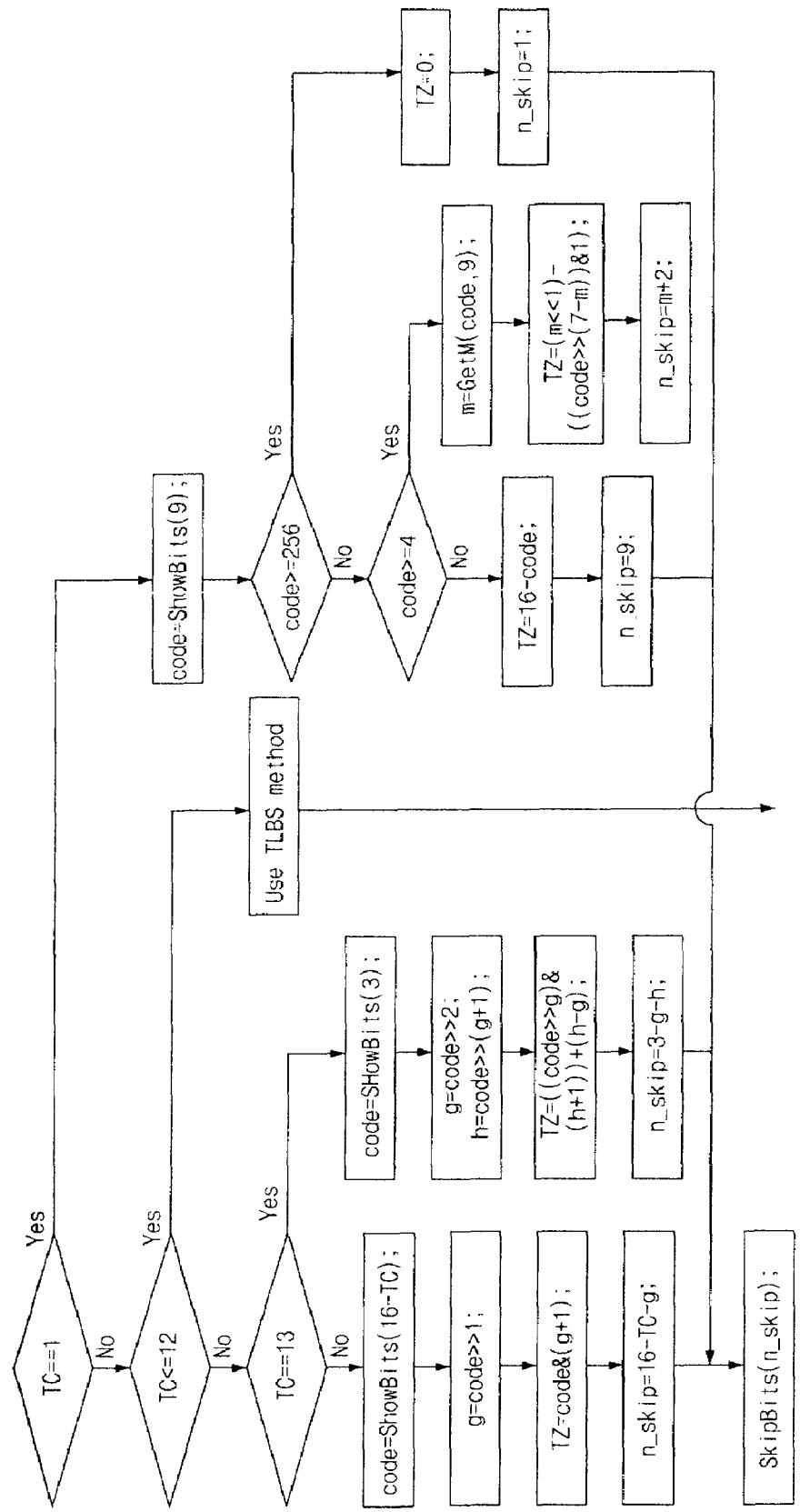

[FIG. 8]
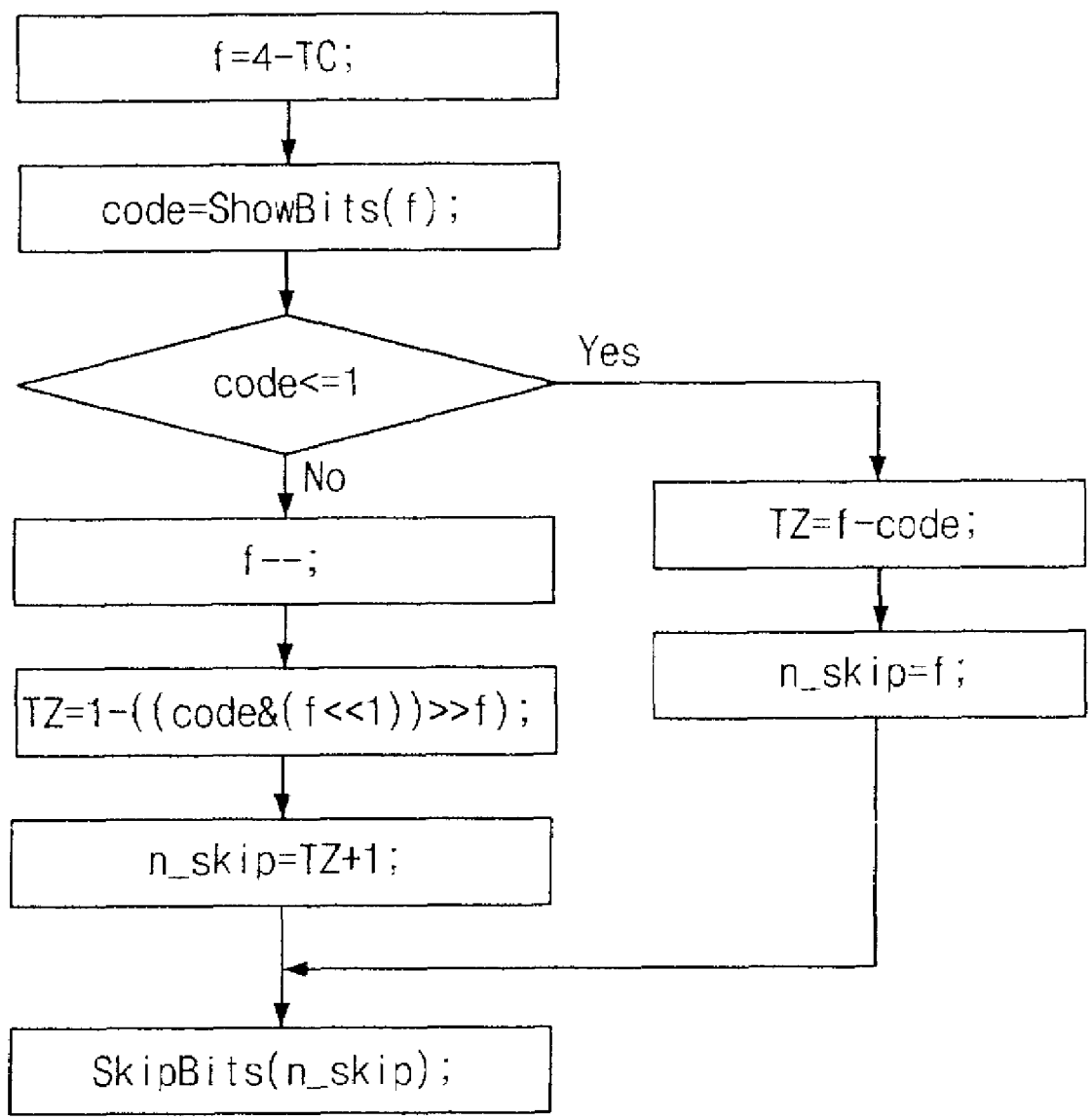

EFFECTIVE DECODING METHOD OF H.264/AVC CONTEXT-BASED ADAPTIVE VARIABLE LENGTH CODING

RELATED APPLICATIONS

The present disclosure relates to subject matter contained in priority Korean Application No. 10-2006-0042514, filed on 11 May 2006 which is herein expressly incorporated by reference in its entirety.

BACKGROUND OF THE INVENTION

The present invention relates to an effective H.264/AVC CAVLC decoding method, and in particular, to an effective H.264/AVC CAVLC decoding method wherein a VLC code is classified into groups according to a correlation thereof, an arithmetic equation is defined for each of the groups, and a decoding is carried out according to the arithmetic equation in order to minimize a memory access by a table look-up and reduce a decoding time and a power consumption.

A H.264/MPEG-4 AVC decoder employs a highly efficient coding scheme including a CAVLC (Context-based Adaptive Variable length Coding) and a CABAC (Context-based Adaptive Binary Arithmetic Coding) as an entropy coding scheme. The CAVLC refers to a scheme wherein a VLC table is adaptively selected using an information of adjacent blocks. Only the CAVLC decoding method that is in direct relation with the present invention will be described in detail. In accordance with the CAVLC scheme, an information required for decoding such a zigzag-scanned quantized DCT (Discrete Cosine Transform) coefficient having a one dimensional arrangement and a coefficient and a length of running zeros. The CAVLC scheme is developed to use numerous statistical characteristics of a 4×4 block. The characteristics are as follows.

1. After a quantization, most of the block generally includes a plurality of zeros. The CAVLC scheme employs a run-level coding in order to simply express the running zeros.

2. After a zigzag scan, first, second and third non-zero coefficients starting from an end of the one dimensional arrangement are likely ±1, and the CAVLC scheme reports a number of the ±1 coefficients (TrailingOnes) via a simple method.

3. A number of non-zero coefficients of the adjacent blocks have correlation with a number of coefficients of a current block. The number of the coefficients is encoded using a look-up table wherein the look-up table is selected according to the number of the non-zero coefficients of the adjacent blocks.

4. A level of the non-zero coefficients tends to be larger at a starting point (around a DC coefficient) of the zigzag-scanned one dimensional arrangement, and tends to get smaller near an end (i.e. closer to a high frequency). The CAVLC scheme utilizes such characteristic to select the VLC look-up table for a level parameter according to a magnitude of a coded level.

The CAVLC encoding of the block progresses according to a plurality of steps. The steps include encoding the number of the coefficients (TotalCoeff) and the number of the ±1 coefficients (TrailingOnes), and encoding a sign of the ±1 coefficients (TrailingOnes). Thereafter, a level of the non-zero coefficients is encoded, and a number of zeros prior to a last coefficient is then encoded. Finally, the length of the running zeros (run) is encoded. In accordance with the H.264/MPEG-4 AVC, the "run" and the "level" are separately encoded in a reverse order of the zigzag scan using the VLC table contrary to MPEG-2 wherein a combination of the "run" and the "level" is encoded.

The decoding process in detail is as follows.

1) Coeff_Token Decoding

A Coeff_Token comprises a combination of a TotalCoeffs and the TrailingOnes. The TotalCoeffs has a value ranging from 0 to 16, and the TrailingOnes has a value ranging from 0 to 3. When three or more TrailingOnes exist, only the last three TrailingOnes correspond, and the rest of the ±1 coefficients are decoded similar to a normal coefficient. Four VLC tables for the Coeff_Token exist and the table is selected adaptively. The VLC table is selected by a mean value nC (=Round[(nA+nB)/2]) of a number of DCT coefficients of a left 4×4 block nA and a number of DCT coefficients of an upper 4×4 block nB. However, when only the upper block is valid, nC=nB, when only the left block is valid, nC=nA, when none of the upper block and the left block is valid, nC=0. Table 1 illustrates a criteria of selecting the VLC table of Coeff_Token.

TABLE 1

| nC | table | meaning |
| --- | --- | --- |
| 0, 1 | Num-VLC0 | the number of the coefficients is small |
| 2, 3 | Num-VLC1 | the number of the coefficients is normal |
| 4, 5, 6, 7 | Num-VLC2 | the number of the coefficients is large |
| 8 or above | Num-FLC | 6-bit FLC (Fixed Length Coding) |

Generally, of the four VLC tables shown in FIG. 1, VLC0, VLC1 and VLC2 is decoded by a table look-up. This is because the Num-VLC table is not structured to be expressed as an arithmetic equation. On the other hand, the Num-FLC table does not require the table look-up because the Num-FLC table has the fixed length coding and is expresses as the arithmetic equation.

2) Sign Decoding of the TrailingOnes

Up to the three ±1 coefficients in the one dimensional arrangement of the zigzag-scanned DCT coefficients is coded. + is encoded as a bit 0 and − as a bit 1. That is, a number of sign bits is equal to the number of the TrailingOnes obtained in 1) above.

The decoding is simply completed by reading a maximum of three bits.

3) A Level Decoding of the Non-Zero Coefficients

The level decoding of the non-zero coefficients is decoded in a reverse order and ±1 decoded in the above 2) is excluded. One of the seven VLC tables is adaptively selected according to a level decoded immediately before.

A level VLC table is structurized such that the level is decoded by a simple arithmetic equation rather than the table look-up.

4) Decoding of a Total_Zeros Which is a Number of Zero Coefficients Prior to a Last Non-Zero Coefficients One of the fifteen VLC tables is selected according to the TotalCoeff value obtained in 1).

Since the selected VLC table is not structurized, the decoding by the table look-up is generally carried out.

5) Decoding of a Run_Before Which is a Number of Zeros Prior to the Each of Non-Zero Coefficients The run_before is decoded in the reverse order, and one of the seven VLC tables is selected according to a ZerosLeft value which is a number of remaining zeros during the decoding of the total_zeros which is the number of total zeros.

Since the selected VLC table is not structurized, the decoding by the table look-up is generally carried out.

Firstly, the above-described decoding by the basic sequential table look-up scheme may be referred to as a TLSS (Table Look-up by Sequential Search).

Secondly, the table look-up by a binary search rather than a sequential search may be employed, which may be referred to as a TLBS (Table look-up by Binary Search). While the TLBS has 55% less memory search than the TLSS, the TLBS requires a random memory access characteristic. Therefore, the TLBS does not provide any large improvement in a CAVLC decoding operation speed.

In order to solve a problem of a large amount of the memory access by the table look-up, Moon's method has been proposed.

In accordance with Moon's method, the amount of memory access is largely reduced by aiming at a low power decoding in a mobile device. In order to reduce the amount of the memory access, a portion of a VLC code having a high frequency of use is decoded by the arithmetic equation, and a rest of the VLC code having a low frequency of use is decoded by the TLSS.

FIG. 1 is a flow diagram illustrating a structure of a run_before decoding algorithm in accordance with a conventional art.

Moon's method only handles coeff_token and run_before VLC decoding. The decoding algorithm is described below.

1) Decoding of coeff_token-VLC0 table 1.1) m is obtained from an inputted bitstream. m denotes a number of bit 0 until bit 1 appears in the bitstream.

1.2) If m is greater than or equal to 4, the TLSS is used. Otherwise, first two bits I [1:0] are read.

1.3) TotalCoeff and T1s are obtained by equations below.

$$T1s = \{m+(d-1)*((m+1)/4)*(d/2)\} \% 4, \text{ (where } d=3-I[1:0])$$

$$TotalCoeff = \{m+d*((m+1)/4)*(d/2)\} \% 4$$

% and / denote a remainder operation and an integer division operation with a rounding 2) Decoding of coeff_token-VLC1 table 2.1) Four bits I[3:0] are read from the bitstream.

2.2) If I[3:2] is zero, the TLSS is used. Otherwise 2.3) is carried out.

2.3) T1s=D+(1−w)*(d/2), where D=3−I[3:2], w=I[3:2]/2, and d=3−I[1:0]

$$TotalCoeff = T1s+(1-w)*(d+1)/4;$$

3) Decoding of coeff_token-VLC0 table 3.1) The four bits I[3:0] are read from the bitstream.

3.2) If I[3] is zero, the TLSS is used. Otherwise 3.3) is carried out.

3.3) T1s=3+(d−3)*w, where d=3−I[1:0] and w=I[3:2] % 2

$$TotalCoeff = d+4*(1-w)$$

A meaning of 1), 2) and 3) is that the VLC code arranged in an upper portion of the VLC table having the high frequency is decoded using the arithmetic equation as described above to reduce the amount of the memory access.

4) run_before decoding

The zero_left value is initialized to the total_zeros value. Thereafter, the zero_left value is substituted with a zero_left-run_before value for every decoding of the run_before value. That is, the zero_left value is the number of remaining zeros.

1. When zero_left≧7 is satisfied, inputted three bits is stored in I[2:0].

If I[2:0] is larger than 0, run_before=7−I[2:0], otherwise run_before=4+m.

2. When zero_left=6 is satisfied, the inputted three bits is stored in I[2:0].

When I[2:0] is smaller than 2, run_before=I[2:0]+1, when I[2:0] is equal to or larger than 6, run_before=zero_left−I[2:0]/2, when I[2:0] is 2 or 4, run_before=I[2:0]+2, and run_before is I[2:0] otherwise.

3. When zero_left is no less than 3 and no more than 5, the inputted three bits is stored in I[2:0].

If zero_left≦3+I[2:−]/2 is satisfied, run_before=3−I[2:0], otherwise run_before=zero_left−I[2:0].

4. When zero_left is 1 or 2, inputted two bits are stored in I[1:0].

If zero_left is 2, run_before=(2−I[1:0])*(1−I[1]), otherwise run_before=1−I[1].

While the TLSS scheme is easy to implement, an unconditional sequential memory access is required. Therefore, a large amount of power consumption may occur in a mobile environment. Moreover, the CAVLC decoding operation time may be extremely long due to a low speed memory that is mainly used in the mobile environment.

While the TLBS scheme is also easy to implement, and has 55% less memory access than the TLSS, the memory access is still relatively large, and the CAVLC decoding operation time is hardly reduced due to the random memory access characteristic.

While Moon's method reduces the amount of memory access by 65% compared to the TLSS, Moon's method fundamentally has a limitation. That is, the amount of the memory access shows an irregular result according to various sequences and picture quality (due to various quantization parameter (QP)) since the VLC code of the coeff_token having the high frequency of use statistically. Moreover, an advantage of converting to the arithmetic equation is faded due to excessive conditional sentences of the run_before decoding. In addition, similar to the TLBS, Moon's method does not provide a large reduction of the CAVLC decoding operation time even though the CAVLC decoding operation time is reduced.

SUMMARY OF THE INVENTION

It is an object of the present invention to provide an effective H.264/AVC CAVLC decoding method wherein a VLC code is classified into groups according to a correlation thereof, an arithmetic equation is defined for each of the groups, and a decoding is carried out according to the arithmetic equation in order to minimize a memory access by a table look-up and reduce a decoding time and a power consumption.

In order to achieve the above-described object, there is provided a method for decoding a context-based adaptive variable length coding, the method comprising steps of: (a) decoding a Coeff_Token consisting of a combination of a TotalCoeffs value TC and TrailingOnes value T1s; (b) decoding a run_before, the run_before being a number of zeros before each of non-zero coefficients; and (c) decoding a total_zeros, the total_zeros being a number of coefficients having a value of the zero before a last non-zero coefficient, wherein each of the steps (a), (b) and (c) comprises (1) sorting and classifying a VLC code according to a predetermined criterion to form groups; (2) assigning an arithmetic equation for a decoding for each of the groups; and (3) carrying out the decoding according to the arithmetic equation.

BRIEF DESCRIPTION OF THE DRAWINGS

FIG. 1 is a flow diagram illustrating a structure of a run_before decoding algorithm in accordance with a conventional art.

FIG. 2 is a flow diagram illustrating a coeff_token VLC0 decoding algorithm of an effective H.264/AVC CAVLC decoding method in accordance with the present invention.

FIG. 3 is a flow diagram illustrating a coeff_token VLC1 decoding algorithm of an effective H.264/AVC CAVLC decoding method in accordance with the present invention.

FIG. 4 is a flow diagram illustrating a coeff_token VLC2 decoding algorithm of an effective H.264/AVC CAVLC decoding method in accordance with the present invention.

FIG. 5 is a flow diagram illustrating a coeff_token DC chroma decoding algorithm of an effective H.264/AVC CAVLC decoding method in accordance with the present invention.

FIG. 6 is a flow diagram illustrating a run_before decoding algorithm of an effective H.264/AVC CAVLC decoding method in accordance with the present invention.

FIG. 7 is a flow diagram illustrating a total_zeros decoding algorithm of an effective H.264/AVC CAVLC decoding method in accordance with the present invention.

FIG. 8 is a flow diagram illustrating a total_zeros chroma DC decoding algorithm of an effective H.264/AVC CAVLC decoding method in accordance with the present invention.

DETAILED DESCRIPTION OF THE INVENTION

The above-described objects and other objects and characteristics and advantages of the present invention will now be described in detail with reference to the accompanied drawings.

A basic principle of the present invention is that, except a level decoding that is already expressed as an arithmetic operation, all tables used in a CAVLC excluding a portion of a total_zeros VLC table is substituted with an arithmetic equation optimized for a CPU arithmetic operation in order to minimize a memory access by a table look-up. That is, after a correlation of a VLC code is analyzed, a related VLC code is classified into groups and the arithmetic equation for decoding the group is defined.

For instance, the VLC code may be classified into the groups according to:

[A.1] a position of bit 1 in the VLC code

[A.2] a continuity of a value of a running VLC code

[A.3] a number of bit 0s until a first bit 1 in a prefix m:VLC which is an exp-golomb code of the VLC code

[A.4] a special case other than [A.1] through [A.3]

It is preferable that a number of the groups is minimized. This is because of an increase in a number of conditional sentences due to an increase in the number of the groups resulting in an increase in an operation time, thereby fading a meaning of converting to the arithmetic equation.

(a) decoding a Coeff_Token consisting of a combination of a TotalCoeffs value TC and TrailingOnes value T1s, (b) decoding a run_before, the run_before being a number of zeros before each of non-zero coefficients, and (c) decoding a total_zeros, the total_zeros being a number of coefficients having a value of the zero before a last non-zero coefficient in accordance with are described below in detail. It should be noted that /* */ in FIGS. 2 through 8 denotes an exemplary criteria for classifying into the groups.

1a. Coeff_Token Decoding Step

The Coeff_Token comprises four VLC tables in total according to an nC value and a luma (Y)/chroma (Cb, Cr). That is, the VLC table of a current 4×4 block is adaptively selected according to a number of non-zero coefficients of adjacent blocks.

Table 2 below illustrates the VLC table of the Coeff_Token according to the nC value. The VLC code in table 2 are not sorted and arranged according to the TrailingOnes(T1s) and the TotalCoeff(TC) values.

TABLE 2

| T1s | TC | $0 \leq nC < 2$ | $2 \leq nC < 4$ | $4 \leq nC < 8$ | $8 \leq nC$ |
|---|---|---|---|---|---|
| 0 | 0 | 1 | 11 | 1111 | 0000 11 |
| 0 | 1 | 001 01 | 0010 11 | 0011 11 | 0000 00 |
| 1 | 1 | 01 | 10 | 1110 | 0000 01 |
| 0 | 2 | 0000 0111 | 0001 11 | 0010 11 | 0001 00 |
| 1 | 2 | 0001 00 | 0011 1 | 0111 1 | 0001 01 |
| 2 | 2 | 001 | 011 | 1101 | 0001 10 |
| 0 | 3 | 0000 0011 1 | 0000 111 | 0010 00 | 0010 00 |
| 1 | 3 | 0000 0110 | 0010 10 | 0110 0 | 0010 01 |
| 2 | 3 | 0000 101 | 0010 01 | 0111 0 | 0010 10 |
| 3 | 3 | 0001 1 | 0101 | 1100 | 0010 11 |
| 0 | 4 | 0000 0001 11 | 0000 0111 | 0001 111 | 0011 00 |
| 1 | 4 | 0000 0011 0 | 0001 10 | 0101 0 | 0011 01 |
| 2 | 4 | 0000 0101 | 0001 01 | 0101 1 | 0011 10 |
| 3 | 4 | 0000 11 | 0100 | 1011 | 0011 11 |
| 0 | 5 | 0000 0000 111 | 0000 0100 | 0001 011 | 0100 00 |
| 1 | 5 | 0000 0001 10 | 0000 110 | 0100 0 | 0100 01 |
| 2 | 5 | 0000 0010 1 | 0000 101 | 0100 1 | 0100 10 |

TABLE 2-continued

| T1s | TC | 0 ≦ nC < 2 | 2 ≦ nC < 4 | 4 ≦ nC < 8 | 8 ≦ nC |
|---|---|---|---|---|---|
| 3 | 5 | 0000 100 | 0010 0 | 1010 | 0100 11 |
| 0 | 6 | 0000 0000 0111 1 | 0000 0011 1 | 0001 001 | 0101 00 |
| 1 | 6 | 0000 0000 110 | 0000 0110 | 0011 10 | 0101 01 |
| 2 | 6 | 0000 0001 01 | 0000 0101 | 0011 01 | 0101 10 |
| 3 | 6 | 0000 0100 | 0010 00 | 1001 | 0101 11 |
| 0 | 7 | 0000 0000 0101 1 | 0000 0001 111 | 0001 000 | 0110 00 |
| 1 | 7 | 0000 0000 0111 0 | 0000 0011 0 | 0010 10 | 0110 01 |
| 2 | 7 | 0000 0000 101 | 0000 0010 1 | 0010 01 | 0110 10 |
| 3 | 7 | 0000 0010 0 | 0001 00 | 1000 | 0110 11 |
| 0 | 8 | 0000 0000 0100 0 | 0000 0001 011 | 0000 1111 | 0111 00 |
| 1 | 8 | 0000 0000 0101 0 | 0000 0001 110 | 0001 110 | 0111 01 |
| 2 | 8 | 0000 0000 0110 1 | 0000 0001 101 | 0001 101 | 0111 10 |
| 3 | 8 | 0000 0001 00 | 0000 100 | 0110 1 | 0111 11 |
| 0 | 9 | 0000 0000 0011 11 | 0000 0000 1111 | 0000 1011 | 1000 00 |
| 1 | 9 | 0000 0000 0011 10 | 0000 0001 010 | 0000 1110 | 1000 01 |
| 2 | 9 | 0000 0000 0100 1 | 0000 0001 001 | 0001 010 | 1000 10 |
| 3 | 9 | 0000 0000 100 | 0000 0010 0 | 0011 00 | 1000 11 |
| 0 | 10 | 0000 0000 0010 11 | 0000 0000 1011 | 0000 0111 1 | 1001 00 |
| 1 | 10 | 0000 0000 0010 10 | 0000 0000 1110 | 0000 1010 | 1001 01 |
| 2 | 10 | 0000 0000 0011 01 | 0000 0000 1101 | 0000 1101 | 1001 10 |
| 3 | 10 | 0000 0000 0110 0 | 0000 0001 100 | 0001 100 | 1001 11 |
| 0 | 11 | 0000 0000 0001 111 | 0000 0000 1000 | 0000 0101 1 | 1010 00 |
| 1 | 11 | 0000 0000 0001 110 | 0000 0000 1010 | 0000 0111 0 | 1010 01 |
| 2 | 11 | 0000 0000 0010 01 | 0000 0000 1001 | 0000 1001 | 1010 10 |
| 3 | 11 | 0000 0000 0011 00 | 0000 0001 000 | 0000 1100 | 1010 11 |
| 0 | 12 | 0000 0000 0001 011 | 0000 0000 0111 1 | 0000 0100 0 | 1011 00 |
| 1 | 12 | 0000 0000 0001 010 | 0000 0000 0111 0 | 0000 0101 0 | 1011 01 |
| 2 | 12 | 0000 0000 0001 101 | 0000 0000 0110 1 | 0000 0110 1 | 1011 10 |
| 3 | 12 | 0000 0000 0010 00 | 0000 0000 1100 | 0000 1000 | 1011 11 |
| 0 | 13 | 0000 0000 0000 1111 | 0000 0000 0101 1 | 0000 0011 01 | 1100 00 |
| 1 | 13 | 0000 0000 0000 001 | 0000 0000 0101 0 | 0000 0011 1 | 1100 01 |
| 2 | 13 | 0000 0000 0001 001 | 0000 0000 0100 1 | 0000 0100 1 | 1100 10 |
| 3 | 13 | 0000 0000 0001 100 | 0000 0000 0110 0 | 0000 0110 0 | 1100 11 |
| 0 | 14 | 0000 0000 0000 1011 | 0000 0000 0011 1 | 0000 0010 01 | 1101 00 |
| 1 | 14 | 0000 0000 0000 1110 | 0000 0000 0010 11 | 0000 0011 00 | 1101 01 |
| 2 | 14 | 0000 0000 0000 1101 | 0000 0000 0011 0 | 0000 0010 11 | 1101 10 |
| 3 | 14 | 0000 0000 0001 000 | 0000 0000 0100 0 | 0000 0010 10 | 1101 11 |
| 0 | 15 | 0000 0000 0000 0111 | 0000 0000 0010 01 | 0000 0001 01 | 1110 00 |
| 1 | 15 | 0000 0000 0000 1010 | 0000 0000 0010 00 | 0000 0010 00 | 1110 01 |
| 2 | 15 | 0000 0000 0000 1001 | 0000 0000 0010 10 | 0000 0001 11 | 1110 10 |
| 3 | 15 | 0000 0000 0000 1100 | 0000 0000 0000 1 | 0000 0001 10 | 1110 11 |
| 0 | 16 | 0000 0000 0000 0100 | 0000 0000 0001 11 | 0000 0000 01 | 1111 00 |
| 1 | 16 | 0000 0000 0000 0110 | 0000 0000 0001 10 | 0000 0001 00 | 1111 01 |
| 2 | 16 | 0000 0000 0000 0101 | 0000 0000 0001 01 | 0000 0000 11 | 1111 10 |
| 3 | 16 | 0000 0000 0000 1000 | 0000 0000 0001 00 | 0000 0000 10 | 1111 11 |

1) VLC0 Table (0≦nC<2)

First, the VLC code of table 2 is sorted according to a bit length and a value.

For instance, the VLC code is expressed as a binary having a length of nine bits, and then sorted according to a value of the binary as shown in FIG. 3. x denotes bit 0 or 1, and grey and white backgrounds denote different groups.

TABLE 3

| Code | Value | Bit count | [Tls, TC] |
|---|---|---|---|
| 1 xxxx xxxx | ≧265 | 1 | [0, 0] |
| 0 1xxx xxxx | ≧128 | 2 | [1, 1] |
| 0 01xx xxxx | ≧64 | 3 | [2, 2] |
| 0 0011 xxxx | ≧48 | 5 | [3, 3] |
| 0 0010 1xxx | ≧40 | 6 | [0, 1] |
| 0 0010 0xxx | ≧32 | 6 | [1, 2] |

TABLE 3-continued

| 0 0001 1xxx | ≧24 | 6 | [3, 4] |
|---|---|---|---|
| 0 0001 01xx | ≧20 | 7 | [2, 3] |
| 0 0001 00xx | ≧16 | 7 | [3, 5] |
| 0 0000 111x | ≧14 | 8 | [0, 2] |
| 0 0000 110x | ≧12 | 8 | [1, 3] |
| 0 0000 101x | ≧10 | 8 | [2, 4] |
| 0 0000 100x | ≧8 | 8 | [3, 6] |
| 0 0000 0111 | 7 | 9 | [0, 3] |
| 0 0000 0110 | 6 | 9 | [1, 4] |
| 0 0000 0101 | 5 | 9 | [2, 5] |
| 0 0000 0100 | 4 | 9 | [3, 7] |

Thereafter, the VLC code is classified into three groups and a single arithmetic equation is defined for each of the three groups. Instead of carrying out a table look-up, the decoding is carried out according to the arithmetic equation defined for each of the three groups.

The VLC code may be expressed as a binary having a length of sixteen bits, and then sorted according to a value of the binary as shown in FIG. 4.

TABLE 4

| Code | Value | Bit count | [Tls, TC] |
|---|---|---|---|
| 0000 0001 11xx xxxx | >= 448 | 10 | [0, 4] |
| 0000 0001 10xx xxxx | >= 384 | 10 | [1, 5] |
| 0000 0001 01xx xxxx | >= 320 | 10 | [2, 6] |
| 0000 0001 00xx xxxx | >= 256 | 10 | [3, 8] |
| 0000 0000 111x xxxx | >= 224 | 11 | [0, 5] |
| 0000 0000 110x xxxx | >= 192 | 11 | [1, 6] |
| 0000 0000 101x xxxx | >= 160 | 11 | [2, 7] |
| 0000 0000 100x xxxx | >= 128 | 11 | [3, 9] |
| 0000 0000 0111 1xxx | >= 120 | 13 | [0, 6] |
| 0000 0000 0111 0xxx | >= 112 | 13 | [1, 7] |
| 0000 0000 0110 1xxx | >= 104 | 13 | [2, 8] |
| 0000 0000 0110 0xxx | >= 96 | 13 | [3, 10] |
| 0000 0000 0101 1xxx | >= 88 | 13 | [0, 7] |
| 0000 0000 0101 0xxx | >= 80 | 13 | [1, 8] |
| 0000 0000 0100 1xxx | >= 72 | 13 | [2, 9] |
| 0000 0000 0100 0xxx | >= 64 | 13 | [0, 8] |
| 0000 0000 0011 11xx | >= 60 | 14 | [0, 9] |
| 0000 0000 0011 10xx | >= 56 | 14 | [1, 9] |
| 0000 0000 0011 01xx | >= 52 | 14 | [2, 10] |
| 0000 0000 0011 00xx | >= 48 | 14 | [3, 11] |
| 0000 0000 0010 11xx | >= 44 | 14 | [0, 10] |
| 0000 0000 0010 10xx | >= 40 | 14 | [1, 10] |
| 0000 0000 0010 01xx | >= 36 | 14 | [2, 11] |
| 0000 0000 0010 00xx | >= 32 | 14 | [3, 12] |
| 0000 0000 0001 111x | >= 30 | 15 | [0, 11] |
| 0000 0000 0001 110x | >= 28 | 15 | [1, 11] |
| 0000 0000 0001 101x | >= 26 | 15 | [2, 12] |
| 0000 0000 0001 100x | >= 24 | 15 | [3, 13] |
| 0000 0000 0001 011x | >= 22 | 15 | [0, 12] |
| 0000 0000 0001 010x | >= 20 | 15 | [1, 12] |
| 0000 0000 0001 001x | >= 18 | 15 | [2, 13] |
| 0000 0000 0001 000x | >= 16 | 15 | [3, 14] |
| 0000 0000 0000 1111 | 15 | 16 | [0, 13] |
| 0000 0000 0000 1110 | 14 | 16 | [1, 14] |
| 0000 0000 0000 1101 | 13 | 16 | [2, 14] |
| 0000 0000 0000 1100 | 12 | 16 | [3, 15] |
| 0000 0000 0000 1011 | 11 | 16 | [0, 14] |
| 0000 0000 0000 1010 | 10 | 16 | [1, 15] |
| 0000 0000 0000 1001 | 9 | 16 | [2, 15] |
| 0000 0000 0000 1000 | 8 | 16 | [3, 16] |
| 0000 0000 0000 0111 | 7 | 16 | [0, 15] |
| 0000 0000 0000 0110 | 6 | 16 | [1, 16] |
| 0000 0000 0000 0101 | 5 | 16 | [2, 16] |
| 0000 0000 0000 0100 | 4 | 16 | [0, 16] |
| 0000 0000 0000 001x | >= 2 | 15 | [1, 13] |

Thereafter, the VLC code is classified into five groups and a single arithmetic equation is defined for each of the five groups. Instead of carrying out a table look-up, the decoding is carried out according to the arithmetic equation defined for each of the five groups.

The reason the VLC code is divided into two sets of nine bits and sixteen bits is that a usage probability of the VLC code corresponding to the set of nine bits is 95%. Therefore, an arithmetic operation efficiency is improved.

FIG. 2 is a flow diagram illustrating a coeff_token VLC0 decoding algorithm of an effective H.264/AVC CAVLC decoding method in accordance with the present invention.

Referring to FIG. 2, T1s denotes TrailingOnes, and TC denotes TotalCoeff. In FIG. 2, ShowBits(n) is a function that returns n bits in a bitstream buffer as a big-endian type, SkipBits(n) is a function that skips the n bits, and GetM(code, a) is a function that returns m in a code having a length of a bit(s). As shown in FIG. 2, when a code value is less than 4, code16 value is obtained, and the arithmetic equation is defined as [T1s=7−(code16>>(g+5)); TC=T1s+5−g+((T1s+1)>>2)] (when code16>=128), [T1s=3−(f&3); TC=T1s+6+((15−f)>>2)+((T1s+1)>>2)](when code16>=64), [T1s=3−(f&3); TC=T1s+10−(g<<1)+((15−f)>>2)+((4−T1s)>>2)] (when code16>=16), [T1s=3−(code16&3); TC=T1s+12+((15−code16)>>2)+((code16&2)>>1)](when code16>=5) and [T1s=1−g; TC=13+3*g] (otherwise) according to code16 value. An arithmetic operation is carried out to obtain the T1s and the TC values. When the code value is equal to or larger than 4, FAST_GETM is used the arithmetic equation in order to comply with a system characteristic or the arithmetic equation is defined as [T1s=(code&256)?0: (3−f); TC=T1s], (when code>=48), [T1s=f+(f>>1); TC=T1s+1] (when code>=24) or [T1s=7−(code>>g); TC=T1s+(3−g)+((T1s+1)>>2)](otherwise) and the arithmetic operation is carried out.

As shown in FIG. 2, an entire decoding process is carried out using only the arithmetic equation without any memory access by the table look-up, and arithmetic operation related to a division (/, %) which requires a long operation time is completely eliminated. In accordance with an experimental result, since the VLC code is searched in the nine bit set with a probability of 95%, a probability that the number of conditional sentence is no more than 4 is more than 95%. In addition, contrary to the conventional method, the method in accordance with the present invention has a simple and consistent structure wherein a condition is only dependent upon the VLC code value. m which requires a large amount of the arithmetic operation for some processors is excluded unless absolutely required. However, FAST_GETM in FIG. 2 is a macro for a system supporting a fast operation for obtaining m such as CLZ (count leading zero) instruction of an ARM v5 processor. That is, while the arithmetic equation using the GetM( ) function is much simpler in a system wherein the GetM( ) function may be executed fast, it is preferable that a use of the GetM( ) function is avoided in a system that does not support the GetM( ) function.

2) VLC1 Table (2≦nC<4)

Similar to the VLC0, after the VLC code is arranged to nine bit and fourteen bit sets, the VLC code is classified to three and four related groups. After the classification, a single arithmetic equation is defined for each of the groups to carry out the decoding without the table look-up.

Tables 5 and 6 illustrate the VLC code classified into the groups.

TABLE 5

| Code | Value | Bit count | [T1s, TC] |
|---|---|---|---|
| 1 1xxx xxxx | >= 384 | 2 | [0, 0] |
| 1 0xxx xxxx | >= 256 | 2 | [1, 1] |
| 0 11xx xxxx | >= 192 | 3 | [2, 2] |
| 0 101x xxxx | >= 160 | 4 | [3, 3] |
| 0 100x xxxx | >= 128 | 4 | [3, 4] |
| 0 0111 xxxx | >= 112 | 5 | [1, 2] |
| 0 0110 xxxx | >= 96 | 5 | [3, 5] |
| 0 0101 1xxx | >= 88 | 6 | [0, 1] |
| 0 0101 0xxx | >= 80 | 6 | [1, 3] |
| 0 0100 1xxx | >= 72 | 6 | [2, 3] |
| 0 0100 0xxx | >= 64 | 6 | [3, 6] |
| 0 0011 1xxx | >= 56 | 6 | [0, 2] |
| 0 0011 0xxx | >= 48 | 6 | [1, 4] |
| 0 0010 1xxx | >= 40 | 6 | [2, 4] |
| 0 0010 0xxx | >= 32 | 6 | [3, 7] |
| 0 0001 11xx | >= 28 | 7 | [0, 3] |
| 0 0001 10xx | >= 24 | 7 | [1, 5] |
| 0 0001 01xx | >= 20 | 7 | [2, 5] |
| 0 0001 00xx | >= 16 | 7 | [3, 8] |
| 0 0000 111x | >= 14 | 8 | [0, 4] |
| 0 0000 110x | >= 12 | 8 | [1, 6] |
| 0 0000 101x | >= 10 | 8 | [2, 6] |
| 0 0000 100x | >= 8 | 8 | [0, 5] |
| 0 0000 0111 | 7 | 9 | [0, 6] |
| 0 0000 0110 | 6 | 9 | [1, 7] |
| 0 0000 0101 | 5 | 9 | [2, 7] |
| 0 0000 0100 | 4 | 9 | [3, 9] |

TABLE 6

| Code | Value | Bit count | [T1s, TC] |
|---|---|---|---|
| 00 0000 0111 1xxx | >= 120 | 11 | [0, 7] |
| 00 0000 0111 0xxx | >= 112 | 11 | [1, 8] |
| 00 0000 0110 1xxx | >= 104 | 11 | [2, 8] |
| 00 0000 0110 0xxx | >= 96 | 11 | [3, 10] |
| 00 0000 0101 1xxx | >= 88 | 11 | [0, 8] |
| 00 0000 0101 0xxx | >= 80 | 11 | [1, 9] |
| 00 0000 0100 1xxx | >= 72 | 11 | [2, 9] |
| 00 0000 0100 0xxx | >= 64 | 11 | [3, 11] |
| 00 0000 0011 11xx | >= 60 | 12 | [0, 9] |
| 00 0000 0011 10xx | >= 56 | 12 | [1, 10] |
| 00 0000 0011 01xx | >= 52 | 12 | [2, 10] |
| 00 0000 0011 00xx | >= 48 | 12 | [3, 12] |
| 00 0000 0010 11xx | >= 44 | 12 | [0, 10] |
| 00 0000 0010 10xx | >= 40 | 12 | [1, 11] |
| 00 0000 0010 01xx | >= 36 | 12 | [2, 11] |
| 00 0000 0010 00xx | >= 32 | 12 | [0, 11] |

TABLE 6-continued

| Code | Value | Bit count | [T1s, TC] |
|---|---|---|---|
| 00 0000 0001 111x | >= 30 | 13 | [0, 12] |
| 00 0000 0001 110x | >= 28 | 13 | [1, 12] |
| 00 0000 0001 101x | >= 26 | 13 | [2, 12] |
| 00 0000 0001 100x | >= 24 | 13 | [3, 13] |
| 00 0000 0001 011x | >= 22 | 13 | [0, 13] |
| 00 0000 0001 010x | >= 20 | 13 | [1, 13] |
| 00 0000 0001 001x | >= 18 | 13 | [2, 13] |
| 00 0000 0001 000x | >= 16 | 13 | [3, 14] |
| 00 0000 0000 111x | >= 14 | 13 | [0, 14] |
| 00 0000 0000 110x | >= 12 | 13 | [2, 14] |
| 00 0000 0000 1011 | 11 | 14 | [1, 14] |
| 00 0000 0000 1010 | 10 | 14 | [2, 15] |
| 00 0000 0000 1001 | 9 | 14 | [0, 15] |
| 00 0000 0000 1000 | 8 | 14 | [1, 15] |
| 00 0000 0000 0111 | 7 | 14 | [0, 16] |
| 00 0000 0000 0110 | 6 | 14 | [1, 16] |
| 00 0000 0000 0101 | 5 | 14 | [2, 16] |
| 00 0000 0000 0100 | 4 | 14 | [3, 16] |
| 00 0000 0000 001x | >= 2 | 14 | [3, 15] |

FIG. 3 is a flow diagram illustrating a coeff_token VLC1 decoding algorithm of an effective H.264/AVC CAVLC decoding method in accordance with the present invention.

As shown in FIG. 3, the decoding method is shown in a C pseudo code. Referring to FIG. 3, the proper arithmetic equation [T1s=(g<<1)+(f>>1); TC=T1s+((g+f)>>2)], [T1s=3−((code>>f)&(3−h)); TC=(3−g)+(k<<1)+(k>>1)], [T1s=3−(f&3); TC=T1s+9−(g<<1)+((15−f)>>2)−((f&1)&(T1s>>1))], [T1s=3−(f&3); TC=12+((15−f)>>2+((T1s+1)>>2)], [T1s=12−code14−3*((13−code14)>>2); TC=17−((code14+1)>>2)] [T1s=(code14<4)?3:(7−code14); TC=15+g] or [T1s=((f−g)==3)?0:(7−f); TC=T1s+(6−g)−(k&(f&1))], for instance, is defined according to the code and code14 value and the T1s and TC values are obtained according to the arithmetic equation. Since the method of FIG. 3 is similar to that of FIG. 2, a detailed description is omitted.

3) VLC2 Table (4≦nC<8)

After the VLC code is arranged to seven bit and ten bit sets, the VLC code is classified into the related groups as shown in tables 7 and 8. After the classification, a single arithmetic equation is defined for each of the groups to carry out the decoding without the table look-up.

TABLE 7

| Code | Value | Bit count | [T1s, TC] |
|---|---|---|---|
| 111 1xxx | >= 120 | 4 | [0, 0] |
| 111 0xxx | >= 112 | 4 | [1, 1] |
| 110 1xxx | >= 104 | 4 | [2, 2] |
| 110 0xxx | >= 96 | 4 | [3, 3] |
| 101 1xxx | >= 88 | 4 | [3, 4] |
| 101 0xxx | >= 80 | 4 | [3, 5] |
| 100 1xxx | >= 72 | 4 | [3, 6] |
| 100 0xxx | >= 64 | 4 | [3, 7] |

TABLE 7-continued

| Code | Value | Bit count | [Tls, TC] |
|---|---|---|---|
| 011 11xx | >= 60 | 5 | [1, 2] |
| 011 10xx | >= 56 | 5 | [2, 3] |
| 011 01xx | >= 52 | 5 | [3, 8] |
| 011 00xx | >= 48 | 5 | [1, 3] |
| 010 11xx | >= 44 | 5 | [2, 4] |
| 010 10xx | >= 40 | 5 | [1, 4] |
| 010 01xx | >= 36 | 5 | [2, 5] |
| 010 00xx | >= 32 | 5 | [1, 5] |

| Code | Value | Bit count | [Tls, TC] |
|---|---|---|---|
| 001 111x | >= 30 | 6 | [0, 1] |
| 001 110x | >= 28 | 6 | [1, 6] |
| 001 101x | >= 26 | 6 | [2, 6] |
| 001 100x | >= 24 | 6 | [3, 9] |
| 001 011x | >= 22 | 6 | [0, 2] |
| 001 010x | >= 20 | 6 | [1, 7] |
| 001 001x | >= 18 | 6 | [2, 7] |
| 001 000x | >= 16 | 6 | [0, 3] |
| 000 1111 | 15 | 7 | [0, 4] |
| 000 1110 | 14 | 7 | [1, 8] |
| 000 1101 | 13 | 7 | [2, 8] |
| 000 1100 | 12 | 7 | [3, 10] |
| 000 1011 | 11 | 7 | [0, 5] |

TABLE 8

| Code | Value | Bit count | [Tls, TC] |
|---|---|---|---|
| 00 0101 0xxx | >= 80 | 7 | [2, 9] |
| 00 0100 1xxx | >= 72 | 7 | [0, 6] |
| 00 0100 0xxx | >= 64 | 7 | [0, 7] |
| 00 0011 11xx | >= 60 | 8 | [0, 8] |
| 00 0011 10xx | >= 56 | 8 | [1, 9] |
| 00 0011 01xx | >= 52 | 8 | [2, 10] |
| 00 0011 00xx | >= 48 | 8 | [3, 11] |
| 00 0010 11xx | >= 44 | 8 | [0, 9] |
| 00 0010 10xx | >= 40 | 8 | [1, 10] |
| 00 0010 01xx | >= 36 | 8 | [2, 11] |
| 00 0010 00xx | >= 32 | 8 | [3, 12] |
| 00 0001 111x | >= 30 | 9 | [0, 10] |
| 00 0001 110x | >= 28 | 9 | [1, 11] |
| 00 0001 101x | >= 26 | 9 | [2, 12] |
| 00 0001 100x | >= 24 | 9 | [3, 13] |
| 00 0001 011x | >= 22 | 9 | [0, 11] |
| 00 0001 010x | >= 20 | 9 | [1, 12] |
| 00 0001 001x | >= 18 | 9 | [2, 13] |
| 00 0001 000x | >= 16 | 9 | [0, 12] |
| 00 0000 111x | >= 14 | 9 | [1, 13] |

TABLE 8-continued

| Code | Value | Bit count | [Tls, TC] |
|---|---|---|---|
| 00 0000 1101 | 13 | 10 | [0, 13] |
| 00 0000 1100 | 12 | 10 | [1, 14] |
| 00 0000 1011 | 11 | 10 | [2, 14] |
| 00 0000 1010 | 10 | 10 | [3, 14] |
| 00 0000 1001 | 9 | 10 | [0, 14] |
| 00 0000 1000 | 8 | 10 | [1, 15] |
| 00 0000 0111 | 7 | 10 | [2, 15] |
| 00 0000 0110 | 6 | 10 | [3, 15] |
| 00 0000 0101 | 5 | 10 | [0, 15] |
| 00 0000 0100 | 4 | 10 | [1, 16] |
| 00 0000 0011 | 3 | 10 | [2, 16] |
| 00 0000 0010 | 2 | 10 | [3, 16] |
| 00 0000 0001 | 1 | 10 | [0, 16] |

FIG. 4 is a flow diagram illustrating a coeff_token VLC2 decoding algorithm of an effective H.264/AVC CAVLC decoding method in accordance with the present invention.

As shown in FIG. 4, the decoding method is shown in the C pseudo code. Referring to FIG. 4, the proper arithmetic equation [T1s=(f>3)?3:f; TC=f], [T1s=(f<4)?f:(1+(f&1)); TC=(f==3)?8:(T1s+(f>>1)+((9−f)>>3))], [T1s=((f+6)>>4)<<1; TC=T1s+7−(f&1)], [T1s=3−(f&3); TC=T1s+((5−g)<<1)+((15−f)>>2)], [T1s=((15−code)&3)*(1−g); TC=(T1s==0)?(7−(code>>2)): (((T1s+7)>>1)<<1)], [T1s=(f&3); TC=(g<<2)+(1+(f>>2))+(g&1)] or [T1s=(code10&2)>>1; TC=T1s+12], [T1s=(13−code10)&3; TC=16−((code10−1)>>2)], for instance, is defined according to the code and code14 value and the T1s and TC values are obtained according to the arithmetic equation. Since the method of FIG. 4 is similar to that of FIGS. 2 and 3, a detailed description is omitted.

4) Chroma DC Table (nC==−1)

In accordance with the chroma DC table, the VLC code is expressed as an eight bit binary and classified into four groups as shown in table 9.

TABLE 9

| Code | Value | Bit count | [Tls, TC] |
|---|---|---|---|
| 1xxx xxxx | >= 128 | 1 | [1, 1] |
| 01xx xxxx | >= 64 | 2 | [0, 0] |
| 001x xxxx | >= 32 | 3 | [2, 2] |
| 0001 11xx | >= 28 | 6 | [0, 1] |
| 0001 10xx | >= 24 | 6 | [1, 2] |
| 0001 01xx | >= 20 | 6 | [3, 3] |
| 0001 00xx | >= 16 | 6 | [0, 2] |
| 0000 11xx | >= 12 | 6 | [0, 3] |
| 0000 10xx | >= 8 | 6 | [0, 4] |
| 0000 011x | >= 6 | 7 | [1, 3] |
| 0000 010x | >= 4 | 7 | [2, 3] |
| 0000 0011 | 3 | 8 | [1, 4] |
| 0000 0010 | 2 | 8 | [2, 4] |
| 0000 000x | >= 0 | 7 | [3, 4] |

FIG. 5 is a flow diagram illustrating a coeff_token DC chroma decoding algorithm of an effective H.264/AVC CAVLC decoding method in accordance with the present invention.

As shown in FIG. 5, the decoding method is shown in the C pseudo code. Referring to FIG. 5, the proper arithmetic equation such as [T1s=(g>>2)+(((9-g)>>3)<<1); TC=T1s], [T1s=((g-1)>>2)*(f+(f>>1)); TC=f+1-(((f+1)>>2)<<1)], [T1s=4-(code8>>g); TC=4-g] and [T1s=3; TC=4] is defined according to a code8 value and the T1s and TC values are obtained according to the arithmetic equation. Since the method of FIG. 5 is similar to that of FIGS. 2 through 4, a detailed description is omitted.

2. run_before decoding step

Seven run_before tables exist according to a zero_left value ZL, and the VLC code in the tables is classified into five groups as shown in table 10. The arithmetic equation is defined for each of the groups and the decoding is carried out according to the arithmetic equation without the table look-up.

TABLE 10

| run_before (RB) | zero_left (ZL) | | | | | | |
|---|---|---|---|---|---|---|---|
| | 1 | 2 | 3 | 4 | 5 | 6 | >6 |
| 0 | 1 | 1 | 11 | 11 | 11 | 11 | 111 |
| 1 | 0 | 01 | 10 | 10 | 10 | 000 | 110 |
| 2 | | 00 | 01 | 01 | 011 | 001 | 101 |
| 3 | | | 00 | 001 | 010 | 011 | 100 |
| 4 | | | | 000 | 001 | 010 | 011 |
| 5 | | | | | 000 | 101 | 010 |
| 6 | | | | | | 100 | 001 |
| 7 | | | | | | | 0001 |
| 8 | | | | | | | 00001 |
| 9 | | | | | | | 000001 |
| 10 | | | | | | | 0000001 |
| 11 | | | | | | | 00000001 |
| 12 | | | | | | | 000000001 |
| 13 | | | | | | | 0000000001 |
| 14 | | | | | | | 00000000001 |

FIG. 6 is a flow diagram illustrating a run_before decoding algorithm of an effective H.264/AVC CAVLC decoding method in accordance with the present invention.

As shown in FIG. 6, the decoding method is shown in the C pseudo code. Referring to FIG. 6, the proper arithmetic equation such as [RB=ZL-(code&((code>>1)+1))], [RB=3-(code>>1)], [RB=(ZL<6)?f:((code<2)?(code+1):f)], [RB=7-(code11>>9)] and [RB=4+m] is defined according to the zero_left ZL value and a run_before value RB is obtained according to the arithmetic equation. Since the method of FIG. 6 is similar to that of FIGS. 2 through 5, a detailed description is omitted.

3. total_zeros decoding step 1) total_zeros tables for 4×4 block

In case of a total_zeros TZ, fifteen total_zeros tables exist according to the TotalCoeff TC value as shown in tables 11 and 12. The VLC code in the total_zeros tables hardly has any correlation. Therefore, a large number of the conditional sentence is required when expresses as the arithmetic equation. In that case, since an operation speed is degraded even more when compared to using the table look-up, the four tables of the fifteen tables having the TotalCoeff value TC of 1, 13, 14 and 15 that have small number of the conditional sentences are expressed as arithmetic equations, and the conventional TLBS (table lookup using binary search) scheme is used for the remaining eleven tables.

TABLE 11

| | TotalCoeff(coeff_token) | | | | | | | |
|---|---|---|---|---|---|---|---|---|
| TZ | 1 | 2 | 3 | 4 | 5 | 6 | 7 | 8 |
| 0 | 1 | 111 | 0101 | 0001 1 | 0101 | 0000 01 | 0000 01 | 0000 01 |
| 1 | 011 | 110 | 111 | 111 | 0100 | 0000 1 | 0000 1 | 0001 |
| 2 | 010 | 101 | 110 | 0101 | 0011 | 111 | 101 | 0000 1 |
| 3 | 0011 | 100 | 101 | 0100 | 111 | 110 | 100 | 011 |
| 4 | 0010 | 011 | 0100 | 100 | 110 | 101 | 011 | 11 |
| 5 | 0001 1 | 0101 | 0011 | 101 | 101 | 100 | 11 | 10 |
| 6 | 0001 0 | 0100 | 100 | 100 | 100 | 011 | 010 | 010 |
| 7 | 0001 11 | 0011 | 011 | 0011 | 011 | 010 | 0001 | 001 |
| 8 | 0000 10 | 0010 | 0010 | 011 | 0010 | 0001 | 001 | 0000 00 |
| 9 | 0000 011 | 0001 1 | 0001 1 | 0010 | 0000 1 | 001 | 0000 00 | |
| 10 | 0000 010 | 0001 0 | 0001 0 | 0001 0 | 0001 | 0000 00 | | |
| 11 | 0000 0011 | 0000 11 | 0000 01 | 0001 1 | 0000 0 | | | |
| 12 | 0000 0010 | 0000 10 | 0000 1 | 0000 0 | | | | |
| 13 | 0000 0001 1 | 0000 01 | 0000 00 | | | | | |
| 14 | 0000 0001 0 | 0000 00 | | | | | | |
| 15 | 0000 0000 1 | | | | | | | |

TABLE 12

| TZ | TotalCoeff(coeff_token) | | | | | | | |
|---|---|---|---|---|---|---|---|---|
| | 8 | 9 | 10 | 11 | 12 | 13 | 14 | 15 |
| 0 | 0000 01 | 0000 01 | 0000 1 | 0000 | 0000 | 000 | 00 | 0 |
| 1 | 0001 | 0000 00 | 0000 0 | 0001 | 0001 | 001 | 01 | 1 |
| 2 | 0000 1 | 0001 | 001 | 001 | 01 | 1 | 1 | |
| 3 | 011 | 11 | 11 | 010 | 1 | 01 | | |
| 4 | 11 | 10 | 10 | 1 | 001 | | | |
| 5 | 10 | 001 | 01 | 011 | | | | |
| 6 | 010 | 01 | 0001 | | | | | |
| 7 | 001 | 0000 1 | | | | | | |
| 8 | 0000 00 | | | | | | | |
| 9 | | | | | | | | |
| 10 | | | | | | | | |
| 11 | | | | | | | | |
| 12 | | | | | | | | |
| 13 | | | | | | | | |
| 14 | | | | | | | | |
| 15 | | | | | | | | |

FIG. 7 is a flow diagram illustrating a total_zeros decoding algorithm of an effective H.264/AVC CAVLC decoding method in accordance with the present invention.

As shown in FIG. 7, the decoding method is shown in the C pseudo code. Referring to FIG. 7, the proper arithmetic equation such as $[TZ=(m<<1)-((code>>(7-m))\&1)]$, $[TZ=((code>>g)\&(h+1))+(h-g)]$ and $[TZ=code\&(g+1)]$ is defined according to the TotalCoeff value TC and the code value and a total_zeros value TZ is obtained according to the arithmetic equation or the TLBS scheme. Since the method of FIG. 7 is similar to that of FIGS. 2 through 6, a detailed description is omitted.

2) total_zeros table for 2×2 chroma DC

A total_zeros chroma DC table shown in table 13 may be classified into tow groups.

TABLE 13

| TZ | TotalCoeff (TC) | | |
|---|---|---|---|
| | 1 | 2 | 3 |
| 0 | 1 | 1 | 1 |
| 1 | 01 | 01 | 0 |
| 2 | 001 | 00 | |
| 3 | 000 | | |

The arithmetic equation is defined for each of the two groups to carry out the decoding without the table look-up.

FIG. 8 is a flow diagram illustrating a total_zeros chroma DC decoding algorithm of an effective H.264/AVC CAVLC decoding method in accordance with the present invention.

As shown in FIG. 8, the decoding method is shown in the C pseudo code. Referring to FIG. 8, the proper arithmetic equation such as $[TZ=f-code]$ and $[TZ=1-((code\&(f<<1))>>f)]$ is defined according to the code value and a total_zeros value TZ is obtained according to the arithmetic equation. Since the method of FIG. 8 is similar to that of FIGS. 2 through 7, a detailed description is omitted.

In accordance with the present invention, since the method of the present invention may be applied to a YCbCr 4:2:2 format when the arithmetic equation for the VLC code related to the chroma is added thereto, the method of the present invention may be applied to any profile that uses the CAVLC as well as a baseline profile. Moreover, since the chroma uses a luma VLC code as is in case of a YCbCr 4:4:4 format, the method of the present invention may also be applied without any modification.

As described above, the effective H.264/AVC CAVLC decoding method of the present invention is advantageous in that the VLC code is classified into the groups according to the correlation thereof, the arithmetic equation is defined for each of the groups, and a decoding is carried out according to the arithmetic equation in order to minimize the memory access by the table look-up and reduce the decoding time and the power consumption.

What is claimed is:

1. A method for decoding a context-based adaptive variable length coding, the method comprising steps of:
    (a) decoding a Coeff_Token consisting of a combination of a TotalCoeffs value TC and TrailingOnes value T1s;
    (b) decoding a run_before, the run_before being a number of zeros before each of non-zero coefficients; and
    (c) decoding a total_zeros, the total_zeros being a number of coefficients having a value of the zero before a last non-zero coefficient,
    wherein each of the steps (a), (b) and (c) comprises
    (1) sorting and classifying a VLC code according to a predetermined criterion to form groups;
    (2) assigning an arithmetic equation for a decoding for each of the groups; and
    (3) carrying out the decoding according to the arithmetic equation.

2. The method in accordance with claim 1, wherein the step (a) comprises:
    (a-1) sorting the VLC code according to a length of a bit and a code value;
    (a-2) classifying the sorted VLC code into the groups having a relation; and
    (a-3) defining a single arithmetic equation for each of the groups and carrying out the decoding according to the arithmetic equation.

3. The method in accordance with claim 2, wherein one of VLC0 through VLC2 tables is selected according to a mean value nC (=Round[(nA+nB)/2]), and the VLC code included in the selected table is subjected to the step (a-1) in the step (a), where nA is a number of DCT coefficients of a left 4×4 block and nB is a number of DCT coefficients of an upper 4×4 block.

4. The method in accordance with claim 3, wherein a chroma DC table is selected when the mean value nC is −1, the VLC0 table is selected when the mean value nC is no less than 0 and less than 2, the VLC1 table is selected when the mean value nC no less than 2 and less than 4, and the VLC2 table is selected when the mean value nC is no less than 4 and less than 8.

5. The method in accordance with claim 4, wherein when the VLC0 table is selected, the step (a-1) comprises expressing the VLC code in a binary having a length of nine bits, the step (a-2) comprises classifying the expressed binary to three groups according to a magnitude of the binary, and the step (a-3) comprises subjecting each of the classified three groups to a FAST_GETM or assigning the arithmetic equation selected from a group consisting of $[T1s=(code\&256)?0:(3-f); TC=T1s]$, $[T1s=f+(f>>1); TC=T1s+1]$ and $[T1s=7-(code>>g); TC=T1s+(3-g)+((T1s+1)>>2)]$ thereto.

6. The method in accordance with claim 4, wherein when the VLC0 table is selected, the step (a-1) comprises expressing the VLC code in a binary having a length of sixteen bits, the step (a-2) comprises classifying the expressed binary to five groups according to a magnitude of the binary, and the step (a-3) comprises assigning the arithmetic equation selected from a group consisting of [T1s=7−(code16>>(g+5)); TC=T1s+5−g+((T1s+1)>>2)], [T1s=3−(f&3); TC=T1s+6+((15−f)>>2)+((T1s+1)>>2)], [T1s=3−(f&3); TC=T1s+10−(g<<1)+((15−f)>>2)+(4−T1s)>>2)], [T1s=3−(code16&3); TC=T1s+12+((15−code16)>>2)+((code16&2)>>1)] and [T1s=1−g; TC=13+3*g] to each of the classified five groups.

7. The method in accordance with claim 4, wherein when the VLC1 table is selected, the step (a-1) comprises expressing the VLC code in a binary having a length of nine bits, the step (a-2) comprises classifying the expressed binary to three groups according to a magnitude of the binary, and the step (a-3) comprises assigning the arithmetic equation selected from a group consisting of [T1s=(g<<1)+(f>>1); TC=T1s+((g+f)>>2)], [T1s=3−((code>>f)&(3−h)); TC=(3−g)+(k<<1)+(k>>1)] and [T1s=((f−g)==3)?0:(7−f); TC=T1s+(6−g)−(k&(f&1))] to each of the classified three groups.

8. The method in accordance with claim 4, wherein when the VLC1 table is selected, the step (a-1) comprises expressing the VLC code in a binary having a length of fourteen bits, the step (a-2) comprises classifying the expressed binary to four groups according to a magnitude of the binary, and the step (a-3) comprises assigning the arithmetic equation selected from a group consisting of [T1s=3−(f&3); TC=T1s+9−(g<<1)+((15−f)>>2) ((f&1)&(T1s>>1))], [T1s=3−(f&3); TC=12+((15−f)>>2+((T1s+1)>>2)], [T1s=12−code14−3*((13−code14)>>2); TC=17−((code14+1)>>2)] and [T1s=(code14<4)?3:(7−code14); TC=15+g] to each of the classified four groups.

9. The method in accordance with claim 4, wherein when the VLC2 table is selected, the step (a-1) comprises expressing the VLC code in a binary having a length of seven bits, the step (a-2) comprises classifying the expressed binary to four groups according to a magnitude of the binary, and the step (a-3) comprises assigning the arithmetic equation selected from a group consisting of [T1s=(f>3)?3:f; TC=f], [T1s=(f<4)?f:(1+(f&1)); TC=(f==3)?8:(T1s+(f>>1)+((9−f)>>3))], [T1s=((15−code)&3)*(1−g); TC=(T1s==0)?(7−(code>>2))(((T1s+7)>>1)<<1)] and [T1s=(f&3); TC=(g<<2)+(1+(f>>2))+(g&1)] to each of the classified four groups.

10. The method in accordance with claim 4, wherein when the VLC2 table is selected, the step (a-1) comprises expressing the VLC code in a binary having a length of ten bits, the step (a-2) comprises classifying the expressed binary to four groups according to a magnitude of the binary, and the step (a-3) comprises assigning the arithmetic equation selected from a group consisting of [T1s=((f+6)>>4)<<1; TC=T1s+7−(f&1)], [T1s=3−(f&3); TC=T1s+((5−g)<<1)+((15−f)>>2)], [T1s=(code10&2)>>1; TC=T1s+12] and [T1s=(13−code10)&3; TC=16−((code10−1)>>2)] to each of the classified four groups.

11. The method in accordance with claim 4, wherein the chroma DC table is selected, the step (a-1) comprises expressing the VLC code in a binary having a length of eight bits, the step (a-2) comprises classifying the expressed binary to four groups according to a magnitude of the binary, and the step (a-3) comprises assigning the arithmetic equation selected from a group consisting of [T1s=(g>>2)+(((9−g)>>3)<<1); TC=T1s], [T1s=((g−1)>>2)*(f+(f>>1)); TC=f+1−(((f+1)>>2)<<1)], [T1s=4−(code8>>g); TC=4−g] and [T1s=3; TC=4] to each of the classified four groups.

12. The method in accordance with claim 2, wherein the step (a-2) is carried out according to a position of bit 1 in the VLC code, a continuity of a value of a running VLC code and a number of bit 0s until a first bit 1 in a prefix m:VLC of an exp-golomb code of the VLC code.

13. The method in accordance with claim 1, wherein the step (b) comprises steps of:
(b-1) classifying the VLC code into a table according to a zero_left value and classifying the VLC code in the table into the groups; and
(b-2) defining a second arithmetic equation for each of the classified groups and carrying out the decoding using the second arithmetic equation.

14. The method in accordance with claim 13, wherein the step (b-1) comprises classifying the VLC code into seven tables according to the zero_left value and classifying the VLC code in the seven tables into five groups, and the step (b-2) comprises assigning the second arithmetic equation selected from a group consisting of [RB=ZL−(code&((code>>1)+1))], [RB=3−(code>>1)], [RB=(ZL<6)?f:((code<2)?(code+1):f)], [RB=7−(code11>>9)] and [RB=4+m] to each of the five groups.

15. The method in accordance with claim 1, wherein the step (c) comprises:
(c-1) classifying the VLC code according to the TotalCoeffs value to generate a table having conditional sentences;
(c-2) defining a third arithmetic equation for the tables having the conditional sentences and carrying out the decoding using the third arithmetic equation when a number of the conditional sentences is no more than a predetermined number;
(c-3) carrying out the decoding via a TLBS method for the tables having the conditional sentences when the number of the conditional sentences is more than the predetermined number.

16. The method in accordance with claim 15, wherein the step (c-1) comprises classifying the VLC code according to the TotalCoeffs value into fifteen total_zeros tables, the step (c-2) comprises defining the third arithmetic equation for the tables having the TotalCoeffs value of 1, 13, 14 and 15 and carrying out the decoding using the third arithmetic equation, and the step (c-3) comprises carrying out the decoding via the TLBS method for the tables the TotalCoeffs value of 2 through 12.

17. The method in accordance with claim 15, wherein the step (c-2) comprises assigning the third arithmetic equation selected from a group consisting of [TZ=0], [TZ=(m<<1)−((code>>(7−m))&1)], [TZ=16−code], [TZ=((code>>g)&(h+1))+(h−g)] and [TZ=code&(g+1)] to each of the tables having the TotalCoeffs value of 1, 13, 14 and 15.

* * * * *